United States Patent [19]

Herchen

[11] Patent Number: 5,870,271
[45] Date of Patent: Feb. 9, 1999

[54] PRESSURE ACTUATED SEALING DIAPHRAGM FOR CHUCKS

[75] Inventor: Harald Herchen, San Jose, Calif.

[73] Assignee: Applied Materials, Inc., Santa Clara, Calif.

[21] Appl. No.: 808,976

[22] Filed: Feb. 19, 1997

[51] Int. Cl.$^6$ .................................................. H02N 13/00
[52] U.S. Cl. ............................................................ 361/234
[58] Field of Search ................................... 279/128, 157, 279/43.9, 3; 361/233, 234

[56] References Cited

U.S. PATENT DOCUMENTS

| | | | |
|---|---|---|---|
| 2,443,987 | 6/1948 | Morrison et al. | 279/3 |
| 3,627,338 | 12/1971 | Thompson | 279/3 |
| 4,184,188 | 1/1980 | Briglia | 361/234 |
| 4,357,006 | 11/1982 | Hayes | 279/3 |
| 4,384,918 | 5/1983 | Abe | 156/643 |
| 4,399,016 | 8/1983 | Tsukada et al. | 204/192 R |
| 4,771,730 | 9/1988 | Tezuka | 118/723 |
| 5,103,367 | 4/1992 | Horwitz et al. | 361/234 |
| 5,275,683 | 1/1994 | Arami et al. | 156/345 |
| 5,363,098 | 11/1994 | Salfelder et al. | 361/234 |
| 5,452,177 | 9/1995 | Frutiger | 361/234 |
| 5,484,485 | 1/1996 | Chapman | 118/723 R |
| 5,486,975 | 1/1996 | Shamouilian et al. | 361/234 |
| 5,530,616 | 6/1996 | Kitabayashi | 361/234 |

FOREIGN PATENT DOCUMENTS

| | | | |
|---|---|---|---|
| 0452222 | 10/1991 | European Pat. Off. | 361/234 |
| 1-298721 | 12/1989 | Japan . | |
| 2-27748 | 1/1990 | Japan . | |

OTHER PUBLICATIONS

Klein, Allen J., "Curing Techniques for Composites," *Advanced Composites*, Mar./Apr. 1988, pp. 32–44.

"Data Sheet—Breathers and Bleeders," Data Sheet from Airtech International, Inc., Carson, California (1993).

"Kapton General Information," Technical Brochure from DuPont de Nemours Company, Wilmington, Delaware (1993).

"R/flex® 1100 High Temperature Materials," Data Sheet DS20903D, Rogers Corporation, Chandler, Arizona (1993).

Daviet, J.F., et al., "Electrostatic Clamping Applied to Semiconductor Plasma Processing. I. Theoretical Modeling," *J. Electrochem. Soc.*, 140(11):3245–3255 (Nov. 1993).

Daviet, J.F., et al., "Electrostatic Clamping Applied to Semiconductor Plasma Process. II. Experimental Results," *J. Electrochem. Soc.*, 140(11):3256–3261 (Nov. 1993).

Steger, R.J., "Heat Transfer in Gas Cooled Pedestals," (Apr. 5, 1991).

Wright, D.R., et al., "Low Temperature Etch Chuck: Modeling and Experimental Results of Heat Transfer and Wafer Temperature," *J. Vac. Sci. Technol.*, 10(4):1065–1070 (Jul./Aug. 1992).

(List continued on next page.)

*Primary Examiner*—Fritz Fleming
*Attorney, Agent, or Firm*—Ashok K. Janah; James C. Wilson; Peter J. Sgarbossa

[57] ABSTRACT

A sealing structure 20 for forming a seal around a chuck 30 used to hold a substrate 45 having a peripheral edge 50. An actuated, position-adjustable, sealing diaphragm 165 is disposed along the peripheral edge of the substrate. The diaphragm has a conformal sealing surface 170 capable of forming a seal when pressed against the peripheral edge of the substrate 45. A diaphragm actuator 175 actuates the sealing diaphragm from (i) a first non-sealing position 180 in which the conformal sealing surface of the diaphragm is spaced apart from the substrate held on the chuck to form a gap 190 therebetween, to (ii) a second sealing position 185 in which the conformal sealing surface of the diaphragm presses against, and forms a seal with, the peripheral edge of the substrate.

27 Claims, 5 Drawing Sheets

OTHER PUBLICATIONS

U.S. Patent Application entitled, "Protective Coating for Dielectric Material on Wafer Support Used in Integrated Circuit Processing Apparatus and Method of Forming Same"; filed Apr. 22, 1993; Serial No. 08/052,018; Inventors: Wu, et al.; Attorney Docket No. 428.

U.S. Patent Application entitled, "Electrostatic Chuck with Erosion–Resistant Electrode Connection"; filed Feb. 22, 1994; Serial No. 08/199,916; Inventors: Shamouilian, et al.; Attorney Docket No. 556–2.

U.S. Patent Application entitled, "Erosion Resistant Electrostatic Chuck"; filed Feb. 22, 1994; Serial No. 08/199,402; Inventors: Shamouilian, et al.; Attorney Docket No. 556.

U.S. Patent Application entitled, "An Electrostatic Chuck Having a Grooved Surface"; filed Jul. 20, 1993; Serial no. 08/094,640; Inventor: Steger; Attorney Docket No. 260.

U.S. Patent Application entitled, "Electrostatic Chuck with Erosion Resistant Electrical Connector"; filed Jul. 19, 1994; Serial no. 08/278,787; Inventors: Cameron, et al.; Attorney Docket No. 556–P1.

U.S. Patent Application entitled, "Erosion Resistant Electrostatic Chuck with Improved Cooling System"; filed Jan. 6, 1995; Serial No. 08/369,237; Inventors: Cameron, et al.; Attorney Docket No. 734.

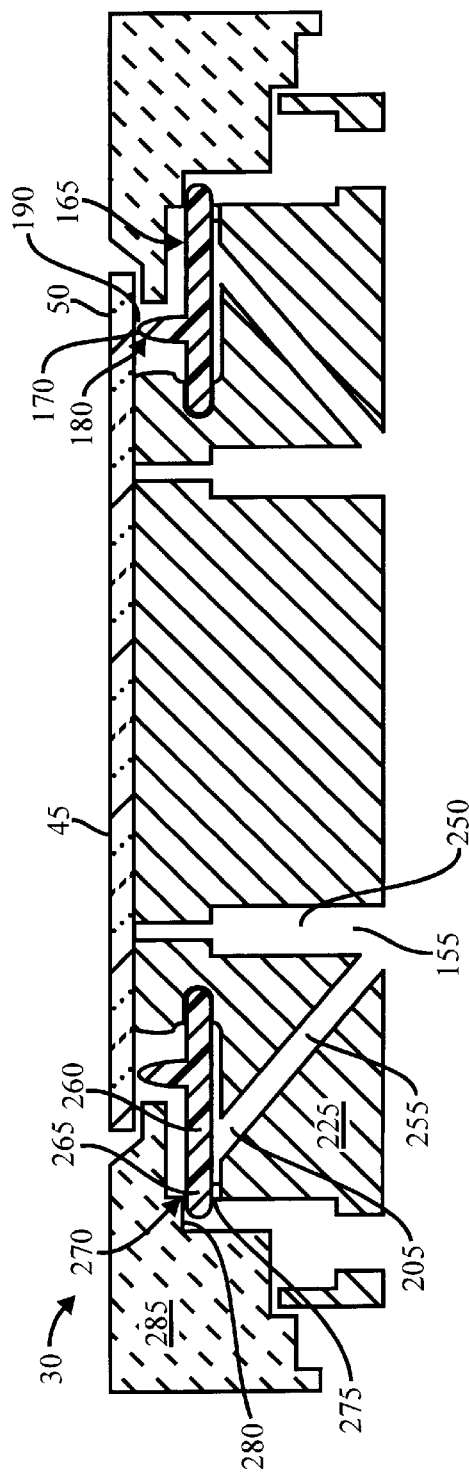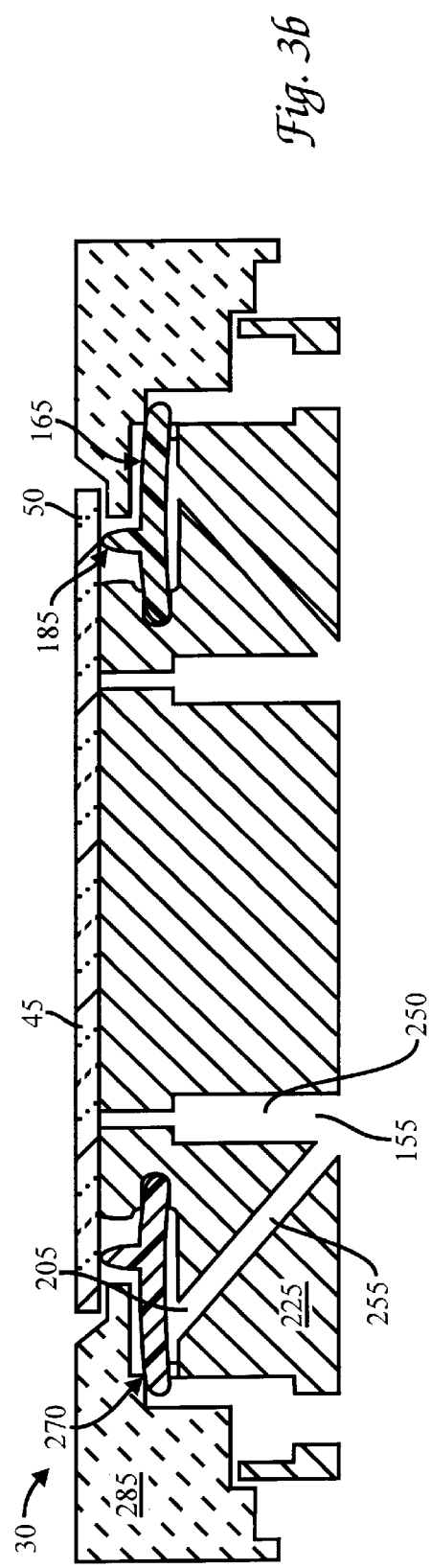

PRESSURE ACTUATED SEALING DIAPHRAGM FOR CHUCKS

BACKGROUND

The present invention is directed to a sealing structure useful for forming a seal around chucks, particularly electrostatic chucks, which are used for holding substrates.

In integrated circuit manufacture, chucks are used to hold semiconductor substrates during processing to prevent movement or misalignment of the substrate. Electrostatic chucks, that use electrostatic attraction forces to hold a substrate, have several advantages over mechanical and vacuum chucks, including reduction of stress-related cracks caused by mechanical clamps; utilization of a larger portion of the substrate surface; reduced formation of corroded particles that deposit on the substrate; and allowing use of the chuck in low pressure processes. A typical electrostatic chuck includes an electrically conductive electrode with an electrical insulator thereon. A voltage source electrically biases the substrate with respect to the electrode. The insulator prevents the flow of electrons therethrough, causing opposing electrostatic charge to accumulate in the substrate and in the electrode, thereby generating an electrostatic force that attracts and holds the substrate onto the chuck. Electrostatic chucks are generally described in, for example U.S. patent application Ser. Nos. 08/278,787 by Cameron, et al.; 08/276,735 by Shamouilian, et al.; and 08/189,562, by Shamouilian, et al.—all of which are incorporated herein by reference.

One problem with conventional chucks is their limited lifetime in erosive process environments. A typical electrostatic chuck comprises a metal electrode covered by a thin polymeric insulator layer. The thin polymeric layer maximizes electrostatic attractive forces between the substrate and the electrode. However, when the insulator comprises a polymer such as a polyimide, the polymer insulator can be rapidly eroded by the erosive process environment, limiting the useful lifetime of the chuck. Erosion of polymer insulators can be particularly severe in oxygen or halogen containing gases and plasmas, which are used for a variety of tasks, such as for example, etching of substrates, deposition of material on substrates, and cleaning of process chambers and substrates. While a large portion of the polymer insulator is covered by the substrate held on the chuck and thereby protected from the erosive environment, the periphery of the insulator is exposed to, and eroded by the erosive gaseous environment. The exposed polymeric insulator can erode in a few hours (typically 2 to 3 hours of exposure to a oxygen plasma environment), and erosion through even a single point on the insulator can expose the electrode causing short-circuiting and failure of the chuck. Failure of the chuck during processing can damage the substrate and reduce yields of the valuable integrated circuit chips formed on the substrate. Also, the polymeric byproducts formed during erosion of the polymer often deposit on the chuck and walls of the process chamber to form hard polymeric deposits which are difficult to clean. Thus it is desirable to reduce the erosion of exposed portions of the chuck, particularly the polymer insulator layers on the chuck.

Several techniques have been developed to reduce erosion of the exposed portions of the chuck. In one solution, described in commonly assigned U.S. patent application Ser. No. 08/410,449, filed on Mar. 24, 1995, which is incorporated herein by reference, a flow of inert or non-reactive "masking" gas is directed onto the peripheral insulator portions of the chuck. The masking gas protects peripheral insulator from the corrosive effect of the surrounding gaseous environment. However, the concentration of masking gas can change the concentration of reactive process gas species adjacent to the edge of the substrate thereby altering the rate of processing, i.e., etching or deposition, at the peripheral edge of the substrate. Also, when the pressure of process gas in the chamber is more than one-tenth of the masking gas pressure, upstream diffusion of masking gas due to concentration gradients reduces the effectiveness of the masking gas. Thus, the masking gas method is undesirable in certain substrate fabrication processes.

Another erosion reducing method uses a barrier ring that extends continuously around the peripheral edge of the insulator and forms a seals against the edge of the substrate. A suitable barrier ring structure, disclosed in U.S. patent application Ser. No. 08/439,010, filed on May 11, 1995, which is incorporated herein by reference, comprises an elastomeric ring having a base resting on a support below the substrate, and an arm extending from the base. When an electrostatic attractive force is applied on the substrate, the substrate moves downward and presses against the upper portion of the arm of the barrier ring to form a seal that reduces exposure of the insulator of the chuck to the corrosive process gas. However, the barrier ring is compressed against the substrate during the entire process cycle and cannot be released from the chuck without terminating the voltage applied to the electrode of the chuck. Terminating the voltage to the chuck electrode releases the substrate from the electrostatic attractive force, which may cause the substrate move during processing. Movement of the substrate during processing is undesirable, particularly for processes where it is necessary for the substrate to be aligned in a particular orientation on the chuck.

The barrier ring can also have problems in highly corrosive process environments where the portion of the barrier ring contacting the substrate can stick to the substrate (due to corrosion in the corrosive process environments) making it difficult to remove the substrate after processing is completed. A slow release or sticking substrate can damage the substrate when a robotic lift arm attempts to lift the substrate off the chuck. Compensating for occasional sticking of the substrate by slowing the speed of the robotic arm, increases substrate processing time and reduces process throughput. Also, sticking portions of the barrier ring can leave behind undesirable contaminants on the substrate that further reduce substrate yields.

Another problem with conventional barrier ring structures arise from the difficulty in fabricating a barrier ring that has consistent and tight tolerance height dimensions (which are needed to apply uniform pressure along the entire peripheral edge of the substrate), particularly when the barrier ring is fabricated from a soft polymer. Conventional polymeric barrier seals typically have height variations that vary by over 250 microns (10 mils). These height variations result in gaps between the barrier ring and the substrate that allow ingress of corrosive gases that react with and erode the insulator of the chuck. To reduce such gaps, the arm of the barrier ring is fabricated with a slightly larger height than necessary to allow compression of the arm by the edge of the overlying substrate when the chuck electrode is powered and the substrate is electrostatically attracted to the chuck. The larger the "excess height" of the barrier ring, the more the variation in height across different portions of the ring that can be tolerated without adversely affecting the continuous seal around the substrate. However, the large height of the barrier ring combined with the variation in height due to manufacturing tolerance limitations creates an upward force on the substrate that opposes the electrostatic force with which the substrate is held on the chuck, increasing the possibility of movement of the substrate during processing. This is a particular problem for electrostatic chucks that provide reduced electrostatic attractive forces, such as bipolar chucks, and chucks required to operate at relatively low operating voltages (less than 2000 volts). If selected portions of the barrier are excessively high, the barrier ring can lift the entire substrate off the surface of such chucks. Also, the large height of the barrier seal further increases the problem of sticking against the substrate due to excessive compression of the seal.

Yet another problem with conventional electrostatic chucks arises from use of heat transfer fluid grooves on the chuck surface which are used to hold a heat transfer fluid for heating or cooling the substrate held on the chuck. Suitable configurations of such heat transfer fluid grooves are described in commonly assigned U.S. patent application Ser. No. 08/276,735 to Shamouilian, et al., which is incorporated herein by reference. When a substrate is held on the chuck, the substrate covers and seals the grooves to reduce leakage of heat transfer fluid held in the grooves. The substrate is typically cooled using a heat transfer gas held in the grooves to reduce overheating of the substrate, and to provide higher yields of integrated circuit chips, particularly at the peripheral edge of the substrate. However, the heat transfer gas often leaks out from below the peripheral edge of the substrate, resulting in overheating of the peripheral portion of the substrate. Also, the leaking gas can adversely effect the process gas composition at the edges of the substrate. Thus, it is desirable to have a sealing structure that reduces leakage of heat transfer gas from the edge of the substrate.

Thus, it is desirable to have a sealing structure to protect the chuck from erosion in the erosive process gas environment and to reduce leakage of heat transfer gas from below the substrate. It is also desirable for the sealing structure to be capable of being actuated or deactuated during processing of the substrate. It is further desirable for the sealing structure to allow rapid placement and removal of the substrate from the chuck without sticking to the substrate and forming contaminants on the substrate. It is also desirable for the structure to seal substantially the entire edge of the insulator without forming gaps through which erosive process gases can access and erode the chuck.

SUMMARY

The sealing structure of the present invention seals and protects a chuck from erosion in erosive environments. The sealing structure is also capable of being actuated or deactuated during processing of the substrate, allowing rapid placement and removal of the substrate, and reducing sticking of the substrate. In one embodiment, the sealing structure forms a seal around a chuck capable of holding a substrate having a peripheral edge. An actuated, position-adjustable, sealing diaphragm is disposed along the peripheral edge of the substrate. The sealing diaphragm has a conformal sealing surface capable of forming a seal when pressed against the peripheral edge of the substrate. A diaphragm actuator is provided for actuating the sealing diaphragm from (i) a first non-sealing position in which the conformal sealing surface of the diaphragm is spaced apart from the substrate held on the chuck to form a gap therebetween, to (ii) a second sealing position in which the conformal sealing surface of the diaphragm presses against, and forms a seal with, the peripheral edge of the substrate. The diaphragm actuator of the sealing structure can comprise an electrical, magnetic, electromagnetic, or gas controller assembly. Preferably, the diaphragm actuator comprises a gas flow or pressure activation means comprising (i) one or more gas apertures below the position-adjustable sealing diaphragm, and (ii) a gas controller to regulate a gas pressure in the gas apertures, after the substrate is held on the chuck, to cause the sealing diaphragm to move between the non-sealing and sealing positions. The gas controller can comprise a mass flow controller or a gas pressure regulator.

In a preferred version, the present invention comprises a gas pressure actuated sealing assembly for reducing corrosion of an electrostatic chuck in a corrosive gas environment. A compliant flat annular membrane extends below the peripheral edge of the substrate, the membrane capping one or more gas apertures. The membrane has a conformal sealing surface that extends continuously below the peripheral edge of the substrate. A gas pressure controller is provided for regulating the pressure of gas maintained in the gas apertures below the membrane at (i) a first pressure at which the sealing member is in a non-sealing position in which the conformal sealing surface of the diaphragm is spaced apart from the electrostatically held substrate to form a gap therebetween, and (ii) a second pressure at which the compliant membrane is in a second sealing position in which the membrane flexes and presses its conformal surface against the peripheral edge of the substrate to form a seal with the peripheral edge of the electrostatically held substrate. Preferably, the second pressure is higher than the first pressure, and is capable of pressing the conformal surface of the membrane against the substrate without dislodging the substrate from the chuck, and without causing heat transfer fluid held in grooves below the chuck from leaking out.

In another aspect, the present invention comprises a corrosion-resistant electrostatic chuck assembly for holding a substrate in a process chamber containing corrosive process gas. The assembly comprises an electrostatic chuck for electrostatically holding a substrate having a peripheral edge. A compliant annular diaphragm extends around the peripheral edge of the substrate, the diaphragm having a conformal sealing surface thereon. At least one gas aperture is below the diaphragm. Application of a gas pressure through the gas aperture causes the diaphragm to flex and press the conformal sealing surface against the substrate.

A method of forming a seal around a chuck in a process zone comprises positioning a gas pressure actuated sealing diaphragm along the peripheral edge of the substrate. The diaphragm caps one or more gas apertures and comprises a conformal sealing surface extending continuously below the peripheral edge of the substrate. Applying a gas pressure through the gas apertures below the diaphragm causes at least a portion of the diaphragm to move and press its conformal sealing surface against the peripheral edge of the substrate to form a seal with the substrate.

Another version of the method is useful for enhancing the erosion resistance of an electrostatic chuck in an erosive environment. The chuck comprises (i) an insulated electrode capable of electrostatically holding a substrate, and (ii) a support for supporting the insulated electrode, the support comprising gas apertures for providing a gas pressure. In the method, an annular sealing diaphragm is positioned to cover the gas apertures on the support so that the diaphragm is circumferentially disposed about the insulated electrode. The sealing diaphragm has a conformal sealing surface capable of forming a seal with a substrate. A substrate is placed on the insulated electrode and a voltage applied to the insulated electrode to electrostatically attract the substrate so that a peripheral edge of the substrate is positioned above the sealing diaphragm to form a gap therebetween. A pressure of gas through the gas apertures below the sealing diaphragm is regulated to cause the conformal sealing surface of the diaphragm to press against the peripheral edge of the substrate forming a seal that reduces exposure of the electrostatic chuck to the erosive environment.

DRAWINGS

These and other features, aspects, and advantages of the present invention will become better understood with regard to the following description, appended claims, and accompanying drawings which provide illustrative examples of the invention, where:

FIG. 3a is a schematic sectional side view of another version of the sealing diaphragm in a non-sealing position;

FIG. 3b is a schematic sectional side view of the sealing diaphragm of FIG. 3a in a sealing position;

FIGS. 5a and 5b are perspective and partial sectional views, respectively, of the sealing diaphragm of FIG. 3a.

DESCRIPTION

Figure 1:
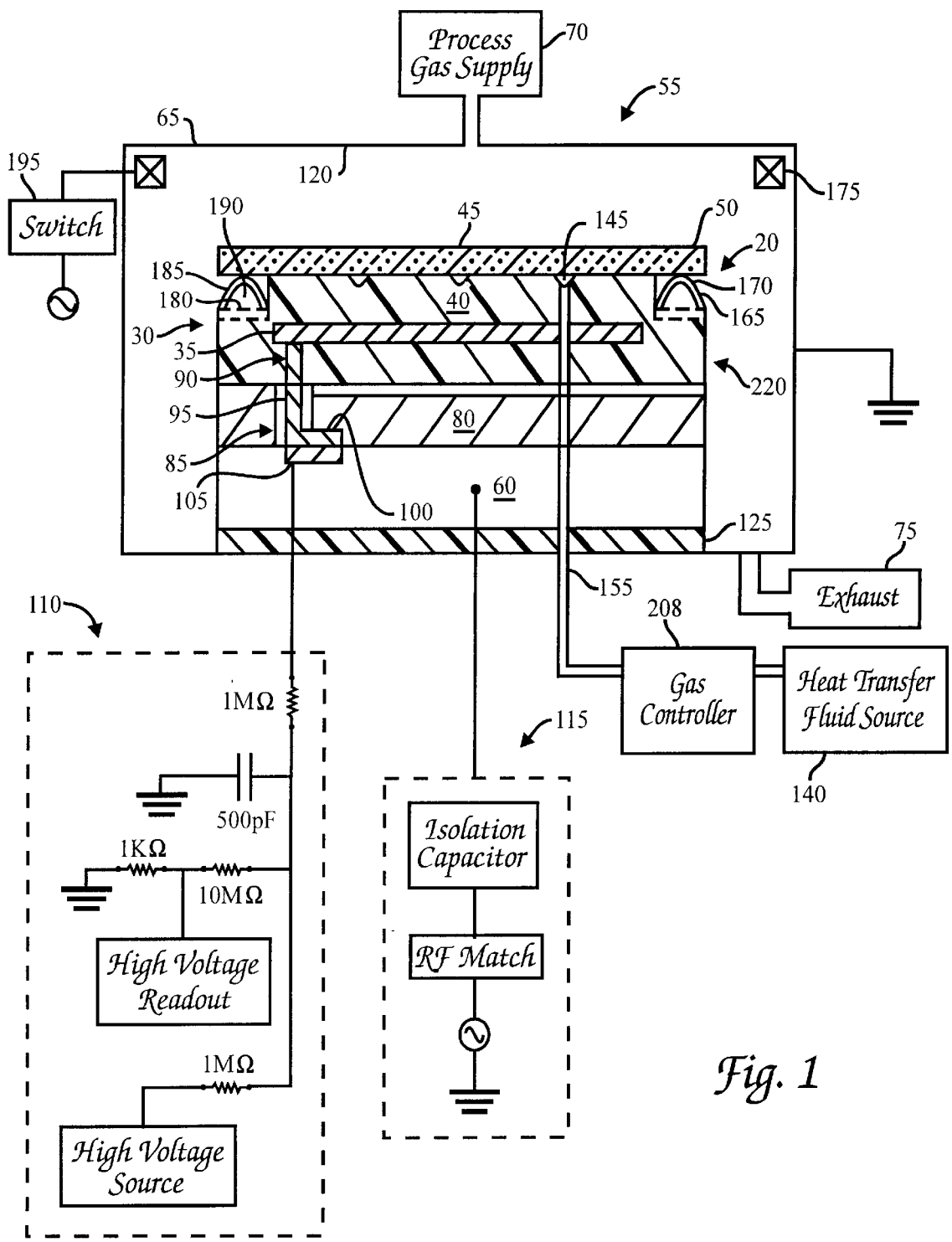
FIG. 1 is a schematic view of a process chamber showing operation of an actuated, position-adjustable, sealing diaphragm around a monopolar electrostatic chuck assembly of the present invention.

The sealing structure 20 of the present invention protects a substrate holder or chuck 30 from erosion in the erosive environments, allows rapid placement and removal of the substrate, seals substantially the entire edge of the substrate holder, and is capable of being actuated or deactuated during processing of the substrate. The sealing structure 20 is illustrated herein in the context of reducing corrosion of an electrostatic chuck 30; however, it should be understood that the structure 20 can be used to form a seal around any chuck or substrate holder, including mechanical and vacuum chucks, and the scope of the present invention should not be limited to electrostatic chucks. As schematically illustrated in FIG. 1, the sealing structure 20 is useful for forming a seal around an electrostatic chuck 30 that comprises one or more electrodes 35 covered by a layer of insulator 40. The electrode 35 is capable of electrostatically holding a substrate 45 when a voltage is applied to the electrodes, as described below. The insulator 40 covers the electrode 35 to electrically insulate the electrode from the process environment. A substrate 45, such as a silicon wafer, having a peripheral edge 50 is electrostatically held on the chuck 30.

Figure 2:
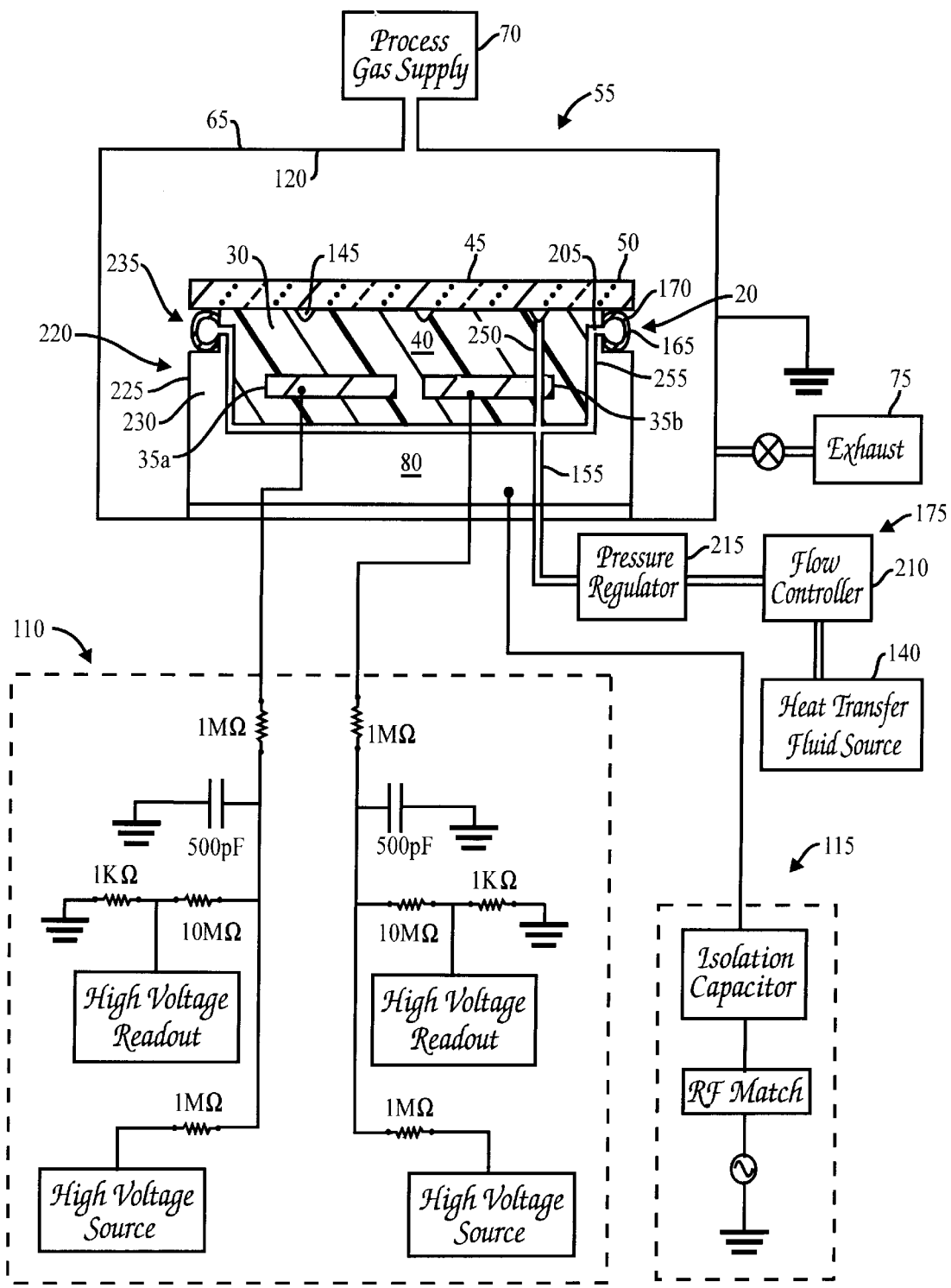
FIG. 2 is a schematic view of a process chamber showing operation of another version of the sealing diaphragm surrounding a bipolar electrostatic chuck assembly of the present invention.

Operation of a sealing structure 20 around an electrostatic chuck 30 according to the present invention, will be described in the context of a semiconductor processing apparatus 55, as schematically illustrated in FIGS. 1 and 2. Although operation of the sealing structure 20 is illustrated in context to the apparatus 55, the invention can also be used in other substrate processing apparati as apparent to those skilled in the art, and should not be limited to the processing apparatus described herein. For example, the apparatus 55 can represent a "PRECISION 5000" magnetically enhanced reactive ion etching apparatus, or a physical vapor deposition apparatus, which are commercially available from Applied Materials, Inc., Santa Clara, Calif. As illustrated in FIG. 1, the electrostatic chuck 30 is secured on a support 60 in a process chamber 65 that forms an enclosure for processing of the substrate 45. The process chamber 65 typically includes a process gas source 70 for introducing process gas into the chamber, and a throttled exhaust 75 for exhausting gaseous byproducts from the chamber. The particular embodiment of the process chamber 65 shown in FIG. 1 is suitable for plasma processing of substrates; however, the present invention can be used with other process chambers or processes without deviating from the scope of the invention.

Typically, the electrostatic chuck 30 further comprises a base 80, with a bore 85 therethrough, that is useful for supporting the electrodes 35 and insulator 40. An electrical connector 90 electrically connects the electrode to a voltage supply. The electrical connector 90 comprises (i) an electrical lead 95 that extends through the bore 85 of the base 80, and (ii) an electrical contact 100 that electrically engages a voltage supply terminal 105 at the interface between the base and the support 60. A first voltage supply 110 provides an electrical voltage to the voltage supply terminal 105 for operating the chuck 30. The first voltage supply 110 typically includes a circuit which comprises (i) a high voltage DC source of about 1000 to 3000 volts, connected to a high voltage readout through a 10 MΩ resistor, (ii) a 1 MΩ resistor in the circuit limits current flowing through the circuit, and (iii) a 500 pF capacitor that serves as an alternating current filter. A second voltage supply 115 is connected to the support 60 in the process chamber 65. At least a portion of the support 60 is typically electrically conductive and functions as a process electrode 25, typically a cathode, for forming a plasma in the chamber 65. The second voltage supply 115 electrically biases the support 60 with respect to an electrically grounded surface 120 in the chamber 65 to form an electric field that generates and/or energizes a plasma formed from the process gas in the chamber. An insulative flange 125 is disposed between the support 60 and the grounded surface 120 to electrically isolate the support 60 from the grounded surface. The second voltage supply 115 generally comprises an RF impedance that matches the impedance of the process chamber 65 to the impedance of the line voltage, in series with an isolation capacitor.

To operate the chuck 30, the process chamber 65 is evacuated and maintained at a sub-atmospheric pressure. A substrate 45 is placed on the chuck 30, and the electrodes 35 of the chuck 30 are electrically biased with respect to the substrate by the first voltage supply 110. Thereafter, process gas is introduced into the chamber 65 via the gas inlet 70, and plasma is formed from the process gas by activating the second voltage supply 115 or by using alternative plasma generator sources, such as inductor coils (not shown). The voltage applied to the electrodes 35 causes electrostatic charge to accumulate in the electrodes, and for the monopolar chuck, the plasma in the chamber 65 provides electrically charged species having opposing polarity which accumulate in the substrate 45. The accumulated opposing electrostatic charge results in an attractive electrostatic force that electrostatically holds the substrate 45 to the chuck 30.

An alternative version of the chuck 30 comprising bipolar electrodes 35a, 35b is illustrated in FIG. 2. In this version, the insulator 40 covers a plurality of electrodes 35a, 35b sized and configured to serve as bipolar electrodes. The first voltage supply 110 provides a differential electrical voltage to the electrodes 35a, 35b. In a preferred configuration, the first voltage supply 110 comprises two DC power supplies that provide a negative voltage to the first electrodes 35a and a positive voltage to the second electrodes 35b to maintain the electrodes at a differential electric potential relative to one another. The opposing electric potentials of the electrodes 35a, 35b induce opposing electrostatic charges in the electrodes and substrate causing the substrate to be electrostatically held to the chuck 30. Bipolar electrode configurations are advantageous for non-plasma processes in which there are no charged plasma species to serve as charge carriers for electrically biasing the substrate 45.

To regulate the temperature of the substrate 45 held on the chuck 30, a heat transfer fluid source 140 is used to supply heat transfer fluid to grooves 145 in the insulator 40. The substrate 45 held on the chuck 30 covers and conforms to the insulator 40, sealing the periphery of the grooves 145 to prevent heat transfer fluid from leaking out. The heat transfer fluid in the grooves 145 can be used to heat or cool the substrate 45 to regulate the temperature of the substrate and maintain the substrate at constant temperatures during processing. Typically, the grooves 145 form a pattern of intersecting channels extending partially or entirely through the composite insulator 40. Heat transfer fluid below the substrate 45 flows into the gap between the substrate and the insulator 40 to provide enhanced thermal coupling and heat transfer by gas conduction between the substrate and the holding surface. Typically, the coolant grooves 145 form a pattern of radial and circumferential intersecting channels extending from below the center of the substrate 45, and having groove tips positioned close to the peripheral edge 50 of the substrate. Preferably, the gap between the coolant groove tips and the peripheral edge 50 of the substrate 45 is less than about 10 mm, more preferably less than about 5 flexible member, and most preferably less than about 3 mm, as described in copending U.S. patent application, entitled "Erosion Resistant Electrostatic Chuck with Improved Cooling System," by Cameron, et al., Ser. No. 08/369,237, filed on Jan. 6, 1995, which is incorporated herein by reference.

The heat transfer fluid can be any liquid or gas capable of transferring heat to the substrate 45, or removing heat from the substrate. The heat transfer fluid can be used to cool or heat the substrate 45 to achieve uniform temperatures on the substrate. When cooling of the substrate 45 is needed, the chuck 30 is maintained at a lower temperature than the substrate, so that the heat transfer fluid can transfer heat from the substrate to the chuck 30. Alternatively, when the substrate 45 is to be heated, the chuck 30 is maintained at a higher temperature than the substrate, so that the heat transfer fluid can transfer heat from the chuck to the substrate. Preferably, the heat transfer fluid comprises a non-reactive gas that is substantially non-reactive to the process environment in the chamber so that leaking heat transfer fluid does not adversely affect the processes performed on the substrate 45. The non-reactive gas should also be non-reactive to the materials used to fabricate the chuck 30, and in particular, to the insulator 40 which is in contact with the non-reactive gas. For example, when polymeric materials such as polyimide are used to fabricate the insulator, reactive gases that erode polyimide, such as (i) oxygen, or (ii) halogen-containing gases, such as $CF_4$ or $C_2F_6$, should be avoided. Preferably, the heat transfer fluid has an elevated thermal conductivity to provide optimal thermal transfer rates between the substrate 45 and the chuck 30. Preferred non-reactive heat transfer fluids that have elevated thermal conductivity comprise helium, argon, nitrogen and the like. The thermal conductivity at about room temperature of argon is about $43 \times 10^{-6}$, nitrogen is about $62 \times 10^{-6}$, and helium is about $360 \times 10^{-6}$ in cal/(sec)($cm^2$)(°C./cm). A heat transfer fluid source 140, such as a tank of compressed helium, is used to supply the heat transfer fluid to the grooves 145 via a supply line 155.

Figure 4B:
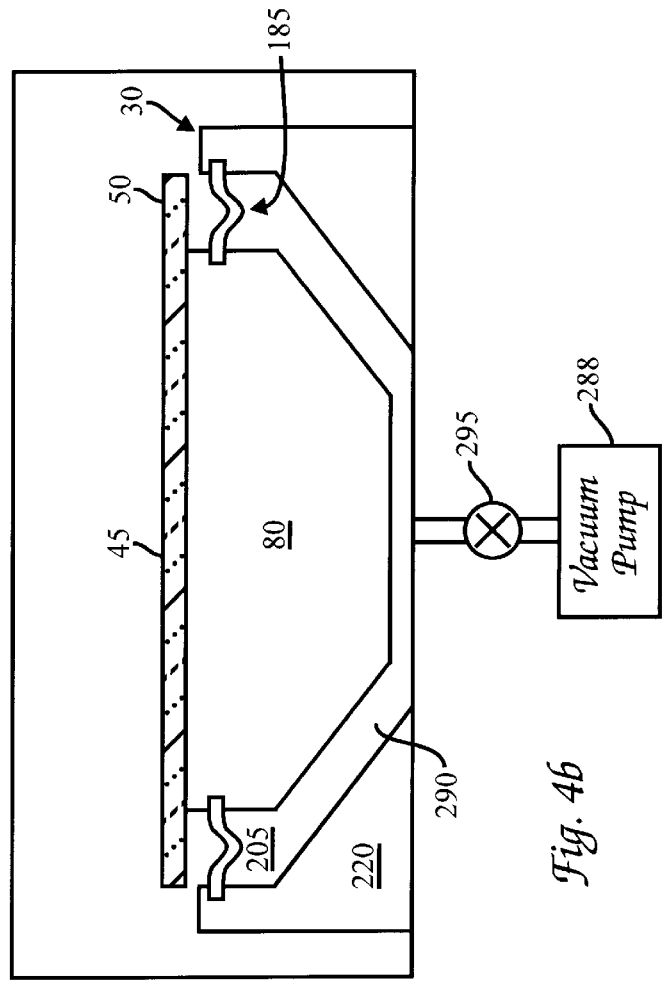
FIG. 4b is a schematic sectional side view of the sealing diaphragm of FIG. 4a in a non-sealing position.
Figure 4A:
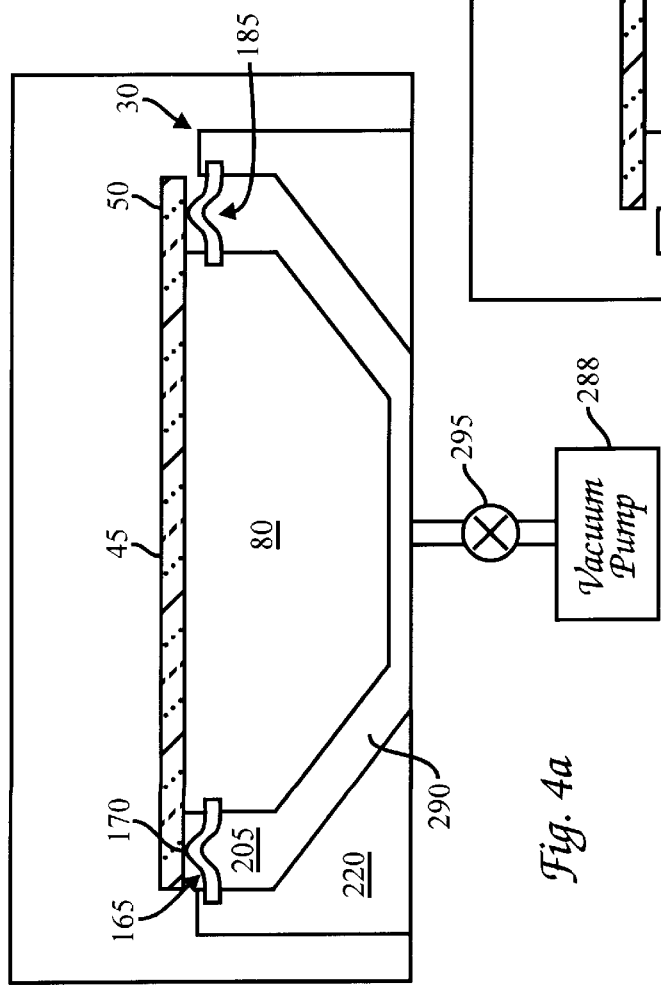
FIG. 4a is a schematic sectional side view of another version of the sealing diaphragm in a sealing position.

As shown in FIG. 1, the sealing structure 20 of the present invention comprises an actuated, position-adjustable, sealing diaphragm 165 circumferentially disposed along, and adjacent to, the peripheral edge 50 of the substrate 45. The sealing diaphragm 165 has a conformal sealing surface 170 capable of forming a seal with the substrate 45 when pressed against the peripheral edge 50 of the substrate 45. An actuating means, such as a diaphragm actuator 175, actuates or adjusts the position of the sealing diaphragm 165 from (i) a non-sealing position 180 in which the conformal sealing surface 170 of the diaphragm is spaced apart from the substrate 45 to form a gap 190 therebetween (as shown in FIGS. 1, 3a, and 4b), to (ii) a sealing position 185 in which the conformal sealing surface of the diaphragm is pressed against, and forms a seal with, the peripheral edge 50 of the substrate (as shown in FIGS. 1, 3b, and 4a). In the sealing position 185, the sealing diaphragm 165 reduces corrosion of the chuck 30 by limiting exposure of the chuck to the erosive process environment, and reduces leakage of heat transfer fluid held below the chuck into the process environment. The sealing diaphragm 165 can also substantially reduce accumulation of polymeric reaction byproducts on the chuck 30, when the chuck was used to hold substrates 45 in erosive process environment. Also, the sealing diaphragm 165 reduces leakage of heat transfer fluid from below the peripheral edge of the substrate 45.

A significant advantage of the position-adjustable sealing diaphragm 165 is the ability to activate and deactivate the diaphragm from the non-sealing position 180 to the sealing position 185 while the substrate 45 is held on the chuck 30 and without releasing the substrate from the chuck 30. Prior art barrier seals typically remain in contact with the substrate 45 during the entire processing cycle because the barrier seals are compressed by the electrostatically attracted substrate during the entire time the substrate is electrostatically held on the chuck 30. During processing, it is undesirable to deactivate the chuck to release the barrier seal because this would cause the substrate to be released from the electrostatic chuck, potentially resulting in movement and misalignment of the substrate. Also, prior art barrier seals typically touch and contact the substrate, even if the electrostatic chuck is turned off and the electrostatic charge is completely discharged from the electrode of the chuck. In contrast, the position-adjustable sealing diaphragm 165 of the present invention can be deactuated and collapsed without releasing the substrate from the electrostatic chuck 30. This reduces sticking of the sealing diaphragm 165 to the substrate 45 during processing of the substrate thereby increasing overall processing throughput. In addition, the ability to turn on and off the sealing function of the diaphragm 165, allows the diaphragm to be selectively used to seal the periphery of the chuck 30, only during substrate processing stages in which an erosive environment is formed in the process chamber 65. This further reduces sticking of the sealing diaphragm 165 to the substrate 45 extending the lifetime of the sealing diaphragm by a factor of 5 to 10 over conventional barrier seals. Furthermore, it was calculated that the force required to actuate the sealing diaphragm was less than about 1 to 2 Newtons compared with a force of about 10 to 13 Newtons required to compress conventional barrier seals. The lower force requirement further enhances the sealing reliability of the sealing diaphragm of the present invention.

In the embodiment shown in FIG. 1, the position-adjustable sealing diaphragm 165 is moved or actuated from the first non-sealing position 180 to the second sealing position 185 using an actuator 175 such as an electrical or electromagnetic assembly that serves to reposition the sealing diaphragm into the sealing position from a non-sealing position. For example, a sealing diaphragm 165 fabricated from a thin metal-containing structure can be moved from the first position 180 to the second position 185 using an electromagnetic actuator 175 positioned adjacent to, above, or within the body of the chuck 30. The electromagnetic actuator 175 can comprise a coil wrapped around a ferromagnetic core, the core positioned in relationship to the chuck 30 such that the magnetic field resulting when a current is applied through the coil, attracts or repels the sealing diaphragm 165 from the non-sealing to the sealing positions 180, 185, and vice versa. A switching means 195 can be used to activate and deactivate the electromagnetic actuator 175, allowing movement of the barrier seal from the non-sealing position 180 to the sealing position 185, and vice versa, during operation of the chuck 30.

In another embodiment, the position-adjustable sealing diaphragm 165 is gas pressure actuated, as shown in FIG. 2. The sealing diaphragm 165 can have any structure that is sufficiently compliant to flex and press the conformal sealing surface 170 against the substrate 45 to form a seal around the substrate, and sufficiently resilient to return to its original configuration upon application or release of a gas pressure. In this version, the position-adjustable sealing diaphragm 165 comprises a compliant flat annular membrane covering or capping one or more gas apertures 205 disposed around the periphery of the chuck 30. Typically, the gas apertures 205 number from about 1 to about 100, and more typically from about 2 to about 20 gas aperture. The gas apertures 205 are connected to a gas channel in the body of the chuck 30 that supplies a gas pressure from a gas source, such as the heat transfer fluid supply 140, outside the process chamber 65. In the non-sealing position, the membrane of the sealing diaphragm 165 rests on the gas apertures 205 forming a gap between the sealing diaphragm and the overhanging peripheral edge 50 of the substrate 45. When a gas pressure is applied below the compliant membrane, the membrane lifts upward, flexes, or inflates from the gas apertures 205, causing the conformal sealing surface 170 to press against the edge 50 of the substrate 45 to form a seal therebetween.

A gas pressure actuator 175 is provided for actuating or switching the position-adjustable sealing diaphragm 165 from the first non-sealing position to the second sealing position. The actuator 175 comprises an actuating means that provides a flow of gas through the gas apertures 205 after the substrate 45 is electrostatically held on the electrostatic chuck 30. Preferably, the actuator means comprises a gas controller assembly 208, as shown in FIG. 1, for adjusting a gas flow and/or a pressure at the gas apertures 205 for regulating gas pressure, from (i) a first flow or pressure at which the sealing member is at the non-sealing position, to (ii) a second flow or pressure at which the sealing diaphragm 165 flexes and presses its conformal surface against the peripheral edge 50 of the substrate 45 to form a seal therebetween. The gas controller 208 can adjust or regulate the gas pressure or flow at the apertures 205 from a first lower pressure to a second higher pressure capable of pressing the sealing diaphragm 165 against the electrostatically held substrate 45. Alternatively, the gas pressure controller 208 can adjust the gas pressure or flow from a first higher pressure in which the sealing diaphragm 165 is sealed against the substrate to a second lower pressure to unseal or move apart the sealing diaphragm from the substrate. As shown in FIG. 2, a suitable gas controller assembly can comprise a mass flow controller 210, such as the Unit 265, commercially available from Unit Instruments, in Torrance, Calif. The gas controller assembly can also comprise a gas pressure regulator 215 which is typically a closed loop controller comprising a pressure sensor, a throttle valve, and a conventional pressure control circuit.

To avoid dislodging the substrate 45 or causing heat transfer fluid to leak out from the grooves 145 below the substrate, the pressure or flow of gas, is regulated to be less than the electrostatic force/area (force per unit area) exerted by the insulated electrode of the chuck 30. When the electrode exerts an electrostatic attractive force/area on the substrate 45 of at least about 5 Torr, and more typically from 10 to 70 Torr; a suitable second higher gas pressure suitable for actuating the sealing diaphragm 165 is less than about 70 Torr, and more typically from 10 to 50 Torr. Moreover, when a gas pressure is applied below the substrate 45, the force exerted by the sealing diaphragm 165 should be smaller than the net force provided by the difference between the electrostatic attractive force and the gas pressure.

Referring to FIG. 2, preferably, the peripheral edge 50 of the substrate 45 overhangs a periphery 220 of the support 60 that extends around the chuck 30. The overhanging peripheral edge 50 of the substrate 45 increases the erosion resistance of the chuck 30 by reducing line-of-sight impact of highly energetic plasma species (having energies in excess of 1000 eV) on the exposed sides of the electrostatic member 25. The sealing diaphragm 165 rests on the periphery 220 of the support 60 that comprises a collar ledge 225 extending around the chuck 30. The collar ledge 225 comprises walls 230 defining a partially open trench 235 therein. The sealing diaphragm 165 is sized to fit within the trench 235 and cover the gas apertures 205 that terminate in the trench. The partially open trench 235 in the collar ledge 225 allows the sealing diaphragm 165 to be securely positioned in the trench to prevent movement or misalignment of the sealing diaphragm 165 during use of the chuck 30. Upon application of a gas pressure below the sealing diaphragm 165, the diaphragm flexes or lifts upward causing the conformal sealing surface 170 to press against the substrate 45. Because the substrate 45 is held by the applied electrostatic force, the substrate remains substantially stationary, and the diaphragm 165 presses against the substrate to form a seal along the peripheral edge 50 of the chuck 30 that reduces leakage of heat transfer fluid from below the peripheral edge 50 of the substrate. The seal formed by the sealing surface 170 also provides a barrier that widely separates the electrode 25 from the surrounding erosive process environment. Upon reduction or termination of the gas pressure, the sealing diaphragm 165 falls back or deflates, forming a gap between the diaphragm and the substrate 45.

In a preferred embodiment as illustrated in FIGS. 3a and 3b, the gas apertures 205 are connected to the gas supply line 155 that provides heat transfer fluid to the region below the substrate 45, allowing a single gas supply 140 to serve both functions of providing heat transfer fluid below the substrate, and providing a gas pressure for activating the sealing diaphragm 165. In this embodiment, the gas supply line 155 bifurcates into a first gas channel 250 that extends to the surface of the chuck 30 to provide heat transfer fluid below the substrate 45, and a second gas channel 255 that terminates at one of the gas inlets 205 below the sealing diaphragm 165. Preferably, the second gas channel 255 extends tangentially at an moderate angle to the first gas channel 250 and terminates at a gas aperture 205 positioned immediately below the sealing diaphragm 165. Alternatively, the second gas channel 255 can comprise a continuous tubular conduit extending across the entire circumference of the chuck 30 with the gas apertures 205 evenly spaced apart along the channel (not shown), or the second gas channel can comprise discrete ducts extending from a gas reservoir supplied by the gas supply to each of the gas apertures (also not shown).

In this embodiment, the sealing diaphragm 165 comprises a flexible member extending between an overhanging collar ring disposed above and along the circumference of the chuck 30. The flexible member comprises (i) a cap portion 260 covering the gas apertures 205 and pressing against the inside sidewall of the ledge 225 to form a partial seal that reduces leakage of the gas pressure applied below the flexible member, and (ii) a pivot portion 265 held in and supported by a bending point or fulcrum 270. The pivot point 270 is defined by an upwardly extending rim 275 on a basal surface of the ledge 225, and a raised ledge 280 on the bottom surface of a collar ring 285 surrounding the chuck. The collar ring 285 is typically a non-conductive ring, such as a ceramic alumina, silica, or quartz ring. The upwardly extending rim 275 and the raised ledge 280 pinch the pivot portion 265 of the flexible member to form the bending point 270. Application of a gas pressure through the gas apertures 205 causes the flexible member to bend about the pivot point 270 raising the sealing portion 260 of the flexible member until the conformal sealing surface 170 of the flexible member contacts and forms a seal against the substrate 45 in the sealing position 185. Release of the gas pressure allows the elasticity of the flexible member to bring itself back to the basal surface of the ledge 225 in the non-sealing position 180.

In another configuration as illustrated in FIGS. 4a and 4b, instead of applying a positive gas pressure, the gas apertures 205 are used to apply a negative gas pressure, such as application of a low pressure vacuum through the gas apertures that pulls or sucks the membrane of the sealing diaphragm 165 toward the gas apertures. In this configuration, gas aperture 205 is connected to a conventional vacuum or low pressure gas pump 288, via a vacuum tube 290. The actuator comprises means to reduce the pressure of gas at the gas apertures, such as a throttle valve 295. The actuator is actuated, for example by opening the valve 295, before or after the substrate 45 is electrostatically held on the chuck 30 to lower the pressure from a first higher pressure to a second lower pressure, causing sealing diaphragm 165 to move from the sealing position 185 to the non-sealing position 180, and vice versa. In the sealing position 185 as shown in FIG. 4a, the membrane of the sealing diaphragm 165 comprises a curved member having an apex with the conformal surface 170 that presses against the substrate 45. Upon application of a reduced gas pressure through the gas apertures 205 in the chamber 65, the sealing diaphragm 165 straightens out, or curves inward, toward the gas inlet 205. The gas pressure applied through the pump can be controlled using the throttle valve 295, a suitable pressure being less than about 5 Torr, and more preferably less than about $1 \times 10^{-3}$ Torr.

Manufacture of Chuck

Methods of manufacturing the electrostatic chuck 30 and sealing diaphragm 165 of the present invention will now be discussed. Referring to FIGS. 3a and 3b, generally, the base 80 of the chuck 30, that is used to support the insulated electrode is shaped and sized according to the shape and size of the substrate 45 to maximize the heat transfer surface between the base and the substrate. For example, if the substrate 45 is disk shaped, a right-cylindrical base 80 is preferred. Typically, the base 80 has a central portion which receives the insulated electrode and a periphery 220 which extends beyond the insulated electrode. The periphery 220 is preferably shaped as a collar ledge 225 which is at a reduced height from the central portion of the base. Preferably, a trench 235 is formed in the periphery 220, to hold the sealing diaphragm 165.

The base 80 is typically machined from aluminum and has a right cylindrical shape, with a diameter of about 100 to 300 mm to match the diameter of the substrate 45 which typically ranges from about 127 to about 203 mm (5–8 inches), and a thickness of about 1.5 to 2 cm. The top and bottom surfaces of the aluminum plate are ground using conventional aluminum grinding techniques, until the surface roughness of the plate is less than about 1 micron. Surface grinding of the plate is essential for the base 80 to uniformly contact the substrate 45 to allow for efficient thermal transfer between the substrate 45, the base 80, and the support 60. After grinding, the plate is thoroughly cleaned to remove grinding debris. Suitable mechanical or vacuum chucks include clamps or vacuum ports on the surface of the chuck that hold the substrate to the chuck.

The electrostatic chuck 30 comprises an (i) an electrode 35 (or electrodes 35a, 35b), and (ii) an insulator 40 covering the electrode. The insulator 40 typically comprises a dielectric ceramic material such as $Al_2O_3$, $TiO_2$, $SiO_2$, SiC, and mixtures and equivalents thereof; or a resilient polymeric dielectric material, such as polyimide, polyketone, polyetherketone, polysulfone, polycarbonate, polystyrene, nylon, polyvinylchloride, polypropylene, polyethersulfone, polyethylene terephthalate, fluoroethylene propylene copolymers, cellulose, triacetates, silicone, and rubber. When a polymer such as polyimide is used, the resilience of the polyimide, as measured by the tensile elastic modulus of the polyimide, is preferably from about 0.25 to about 10 GPa, and more preferably from about 1 to about 5 GPa. Typical polymeric insulators have (i) a dielectric constant of at least about 2, and more preferably at least about 3; (ii) a resistivity ranging from about $10^{13}$ Ω cm to $10^{20}$ Ω cm; and (iii) a dielectric breakdown strength of at least about 100 volts/mil (3.9 volts/micron), and more typically at least about 1000 volts/mil (39 volts/micron).

The insulator 40 is sized sufficiently large to cover, and more preferably enclose, the electrode 35 (or the electrodes 35a, 35b). The thickness of the insulator 40 required to electrically insulate the electrode 35 varies according to the electrical resistivity and dielectric constant of the polymer used to form the insulator. The insulator 40 should have a sufficient thickness to conform to the substrate 45 under the electrostatic clamping force applied on the substrate so that the coolant grooves 145 in the insulator 40 are substantially sealed by the substrate. When the polymer has a dielectric constant of about 3.5, the insulator 40 is typically about 10 $\mu$m to about 500 $\mu$m thick, and preferably from about 100 $\mu$m to about 300 $\mu$m thick.

Preferably, the insulator 40 is resistant to temperatures in excess of 50° C., and more preferably resistant to temperatures in excess of 100° C., so that the chuck 30 can be used in processes where the substrate 45 is heated. Also, preferably, the insulator 40 has a high thermal conductivity so that heat generated in the substrate 45 during processing can dissipate through the chuck 30. The thermal conductivity of the insulator 40 should be at least about 0.10 Watts/m/K, to allow sufficient heat transfer to preclude overheating of the substrate 45.

The insulator 40 can also be made from high thermal conductivity ceramic material, such as silicon nitride, mullite, diamond, alumina, zirconium boride, boron nitride, aluminum nitride, and mixtures and equivalents thereof, using conventional ceramic processing methods. Alternatively, a high thermal conductivity filler can be added to the insulator 40, the filler material being typically in the form of a powder with an average particle size of less than about 10 $\mu$m, and dispersed in the insulator in a volumetric ratio from about 10% to 80%, and more typically from about 20% to 50%.

The electrode 35 (or electrodes 35a, 35b) are typically made from an electrically conductive material, such as for example, metals including copper, nickel, chromium, aluminum, iron, and alloys thereof. Typically, the thickness of the electrode 35 is from about 0.5 $\mu$m to 100 $\mu$m, and more preferably the thickness is of the electrode is from about 1 $\mu$m to 50 $\mu$m, the thinner electrode providing enhanced erosion resistance for the chuck 30. The shape of the electrode 35 varies according to the size and shape of the substrate 45. For example, if the substrate 45 is disk shaped, the electrode 35 is also disk shaped to maximize the area of the electrode 35 in contact with the substrate 45. Typically, the electrode 35 has an area of from about 200 to about 400 cm$^2$, and more typically from 250 to 350 cm$^2$. The electrode 35 can be a unitary continuous sheet or a patterned electrode, capable of operating as a unipolar electrode 35, as shown in FIG. 1. In another configuration the electrode 35 comprises two or more bipolar electrodes 35a, 35b, as shown in FIG. 2, each of the bipolar electrodes having substantially equal sizes and shapes.

Preferably, the electrode 35 is fabricated as an electrically conductive layer, such as a metal layer, embedded in an insulative layer 40 of a commercially available insulator material. The insulative layer 40 can comprise an upper insulator layer made of more elastic polymeric layer that allows cushioning and sealing of the coolant grooves 145, and the lower insulator layer made of a more dielectric polymer to provide optimal electrical insolation of the electrode 35. Preferred multilayer insulator configurations are for example described in aforementioned U.S. patent application Ser. No. 08/369,237. Typically, the thickness of each insulator layer is from about 50 $\mu$m to about 100 $\mu$m. Suitable commercially insulative polymer films include for example, "KAPTON," a polyimide film manufactured by DuPont de Nemours Co., Wilmington, Del.; "APIQUEO" fabricated by Kanegafuchi Chemical Indus., Japan; "UPILEX" manufactured by Ube Indus. Ltd., Japan; "NITOMID" fabricated by Nitto Electric Indus. Co. Ltd., Japan; and "SUPERIOR FILM" fabricated by Mitsubishi Plastics Indus. Ltd., Japan.

The coolant grooves 145 are cut through one or both insulative layers of the multilayer insulator by stamping, pressing, or punching the grooves through the insulator 40. Preferably, the grooves 145 cut through only the upper insulative layer with the tips of the grooves extending close to a peripheral edge 50 of the substrate 45. After forming the coolant grooves 145, the multilayer insulator 40 and electrode assembly is centered on, and adhered to the base 80 of the chuck 30. Conventional adhesives are used to adhere the insulative layers together, the adhesives including (i) thermally actuated adhesives which are non-tacky at room temperatures and tacky at elevated temperatures, or (ii) pressure sensitive adhesives which are tacky under pressure. Suitable adhesives include for example acrylics such as methacrylate, polyesters, polyamides, polyurethanes, epoxies, silicone containing adhesives, and mixtures thereof.

Methods of fabricating the insulator laminate are generally described in the U.S. patent application Ser. No. 08/199,916, entitled "Electrostatic Chuck with Erosion-Resistant Electrode Connection," filed Feb. 2, 1994, by Shamouilian, et al.

Another method for fabricating the insulated electrode uses a multilayer film, comprising an insulator layer 40 having an electrically conductive copper or aluminum layer thereon. Suitable commercially available multilayer films include for example, "R/FLEX 1100" film comprising a 25 to 125 $\mu$m thick polyimide film with a copper layer deposited thereon, from Rogers Corporation, Chandler, Ariz.; Ablestik brand aluminum-filled polyimide film available from Ablestik Corporation; and Paralux® AP film, comprising polyimide directly bonded (without an adhesive) to rolled, annealed, or electrodeposited copper foil. A patterned or segmented electrode 35 is formed on the insulator 40 and is fabricated by etching, routing or milling the conductive layer to form the desired segmented electrode configuration. Conventional photolithographic and etching methods can be used to etch the electrode 35, for example by (i) forming a patterned photoresist layer of "RISTON" fabricated by DuPont de Nemours Chemical Co. on the conductive metal layer using conventional photolithographic methods, as generally described in *Silicon Processing for the VLSI Era. Volume 1: Process Technology,* Chapters 12, 13, and 14, by Stanley Wolf and Richard N. Tauber, Lattice Press, California (1986), which is incorporated herein by reference, and (ii) etching the exposed portions of the conductive layer using conventional wet or plasma etching techniques. In a typical wet chemical etching method the multilayer film is immersed in an etchant such as ferric chloride, sodium persulfate, or into an acid or base. A typical plasma etching processes uses a plasma of chlorine, oxygen, or SiCl$_4$, to etch the conductive layer, as generally described in *VLSI Technology,* Second Edition, Chapter 5, by S. M. Sze, McGraw-Hill Publishing Company (1988), which is incorporated herein by reference. Residual photoresist can be removed using a conventional acid or oxygen plasma stripping process. After etching, a second insulator film is adhered over the patterned electrode 35 to embed the electrode within the insulator 40, as described above.

The insulated electrode is connected to the terminal 105 via an electrical connector 90. Preferably, the electrical connector 90 extends through the support 60, rather than around the edge 50 of the support, so that during processing the substrate 45 covers the electrical connector and reduces exposure of the connector to the erosive process gases in the chamber Preferred electrical connectors are described in aforementioned U.S. patent application Ser. No. 08/410,449.

Manufacture of Sealing Diaphragm

Figure 5A:
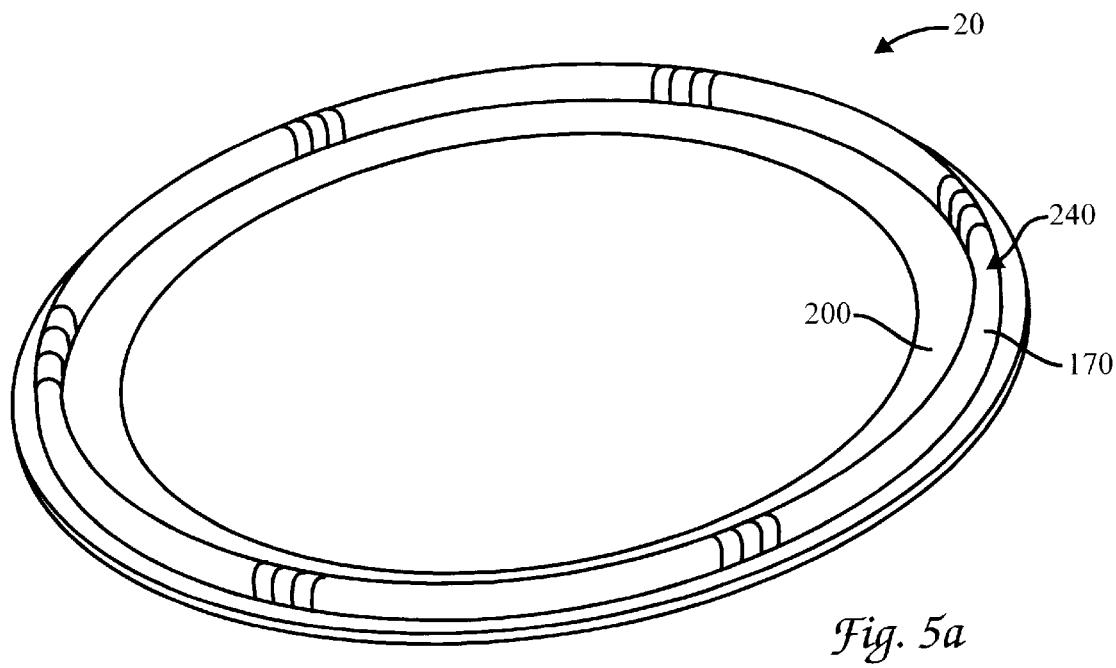
Figure 5B:
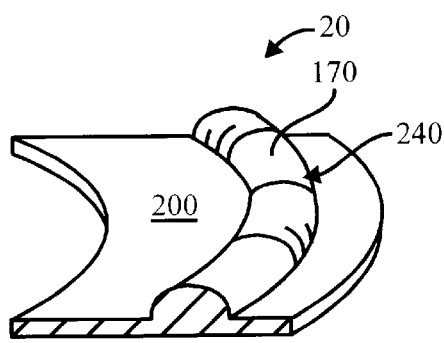

Preferably, the sealing diaphragm 165 comprises an flat annular membrane 200 as shown in FIGS. 5a and 5b, having an area sized sufficiently large that the force exerted by the gas pressure from the gas apertures 205 causes the membrane to form a seal with the substrate 45. Typically, the membrane 200 comprises an area of less than about 50 cm$^2$, and more typically from about 10 cm$^2$ to about 30 cm$^2$. The reduced volume of the sealing diaphragm of about 5 cm$^3$ from 20 cm$^3$ reduces the cost of fabricating the seals from costly erosion-resistant materials by at least 50% over conventional barrier seals. The membrane 200 is shaped as a flat or planar ring, and more preferably as an flat annular section of a cylinder, having a thickness of about 1 cm. In a preferred configuration, the membrane 200 can comprise an upstanding nipple 240 having a top surface comprising the conformal sealing surface 170. This structure provides a small contact area on top of the nipple for contacting and pressing against the substrate 45.

Preferably, the conformal sealing surface 170 of the sealing diaphragm 165 is sufficiently compliant to allow substantially no heat transfer fluid to leak out, or erosive process gas to access the inner portions of the insulator 40 adjacent to the electrode 25. The surface area of the sealing surface 170 of the sealing diaphragm 165 should be sufficiently small that the sealing diaphragm does not act as a thermal insulator that reduces heat flow from the substrate 45. It has been discovered that if the area of the sealing surface 170 is too large, the sealing diaphragm 165 acts as a thermal insulator and raises the temperature of the perimeter 50 of the substrate 45 at those regions close to the contact surface 65. Thus preferably the contact area of the sealing surface 170 is sufficiently small to maintain the perimeter 50 of the substrate 45 at temperatures less than about 100° C., and more preferably less than about 80° C. Preferably, the contact area for the sealing surface 170 is less than about 30 cm$^2$, and more typically less than about 20 cm$^2$.

Preferably, the conformal sealing surface 170 of the sealing diaphragm 165 is located sufficiently close to the peripheral edge 50 of the substrate 45, that when the substrate is cooled, the coolant in the grooves 145 can maintain the temperatures at the peripheral edge 50 of the substrate substantially equivalent to the temperatures at the center of the substrate. By "substantially equivalent" it is meant that the difference in average temperatures of the peripheral edge 50 and center of the substrate 45 is less than about 10° C., more preferably less than about 7° C., and most preferably less than about 5° C. Typically, the sealing surface 170 of the sealing diaphragm 165 contacts the peripheral edge 50 of the substrate 45 within about 10 cm, and more preferably 5 cm, from the peripheral edge of the substrate.

The entire sealing diaphragm 165, or the compliant membrane 200 portion of the diaphragm, is preferably fabricated from a compliant and resilient polymeric material, such as polyimide, polyketone, polyetherketone, polysulfone, polycarbonate, polystyrene, nylon, polyvinylchloride, polypropylene, polyethersulfone, polyethylene terephthalate, fluoroethylene propylene copolymers, cellulose, triacetates, silicone, and rubber. The polymer should be resilient enough to deform slightly under the electrostatic clamping pressure to conform to the substrate to form a seal therebetween. Preferably, the polymer is also substantially resistant to chemical degradation and erosion by the erosive process gas. Preferred polymers include elastomers, such as for example, natural rubber (with an elastic modulus of 2500 psi), "SBR" (2500 psi), acrylate, butyl (1000 psi), chlorosulfonated polyethylene, "EPDM," epichlorohydrin, fluorinated rubbers (250 psi), neoprene (1000 psi), nitrile (1500 psi), polybutadiene, polyisoprene (2500 psi), polysulfide (1400 psi), silicone, and urethane (1200 psi). The reported modulus values which range from 250 to 2500 psi, and more typically 1000 to 2000 psi, were measured at 300–400% elongation. Elastomers are generally described in *Textbook of Polymer Science*, Third Edition, Fred W. Billmeyer, John Wiley & Sons, New York, 1984, which is incorporated herein by reference. Preferred commercially available erosion resistant elastomers include halogenated elastomers, such as "VITON" a fluorine containing elastomer, and "CHEMRAZ-570" perfluoroelastomers, both commercially available from Greene Tweed, Culpsville, Pa. Alternative materials include "KALREZ," a fluoropolymer commercially available from Dupont de Nemours, Wilmington, Del. Conventional fabrication methods, such as pressure die casting, injection molding, or casting methods, can be used to form the sealing diaphragm 165.

Operation of the Chuck

Referring to FIG. 1, operation of the sealing structure 20 and the electrostatic chuck 30 for holding a substrate 45 in a process chamber 65 will now be described. The process chamber 65 is evacuated to a pressure ranging from about 1 to about 500 mTorr, and more typically from about 10 to about 100 mTorr. A semiconductor substrate 45, such as a silicon wafer, is transferred to the chamber 65 from a load lock transfer chamber (not shown), and placed on the insulator 40 of the chuck 30. Process gas is introduced in the process chamber 65, the type of process gas varying according to whether the substrate 45 is being etched, cleaned, or whether material is being deposited on the substrate. For example, conventional etchant gases include for example, $Cl_2$, $BCl_3$, $CCl_4$, $SiCl_4$, $CF_4$, $NF_3$, and mixtures thereof, as described in S. Wolf and R. N. Tauber, *Silicon Processing for the VLSI Era*, Vol. I, Chap. 16: Dry Etching for VLSI, Lattice Press, Sunset Beach, Calif. (1986), which is incorporated herein by reference.

The second voltage supply 115 is activated to electrically bias the support 60 with respect to the grounded surface 120 in the chamber 65 to form a plasma from the process gas. Thereafter, the first voltage supply 110 applies a voltage to the electrode 35 of the chuck 30 to electrical bias the electrode with respect to the substrate 45 to electrostatically attract and hold the substrate 45 to the chuck 30.

A gas pressure actuated sealing diaphragm 165 having a conformal sealing surface 170 is positioned below the peripheral edge of the substrate, capping one or more gas apertures 205. Thereafter, a gas controller applies a gas pressure of 4 Torr through the gas apertures 205. The gas pressure is applied using heat transfer fluid, such as helium, from the heat transfer fluid source 140 connected to the grooves 145 in the chuck 30. The flow of the heat transfer fluid beneath the substrate 45 removes heat from the substrate and maintains substantially uniform temperatures across the substrate during processing. In addition, the pressure of gas at the gas apertures 205 causes the sealing diaphragm 165 to be actuated from the non-sealing position 180 to the sealing position 185. The gas pressure causes the sealing diaphragm 165 to flex and bow toward the substrate 45 pressing the conformal surface of the diaphragm against the peripheral edge 50 of the substrate to form a seal between the substrate and the support 60. Because the pressure of the gas used to actuate the sealing diaphragm 165 is the same pressure as that of the heat transfer gas below the substrate 45, a single pressure which is lower than the electrostatic attractive force exerted on the substrate is applied on the sealing diaphragm 165. This prevents dislodging the substrate from the chuck, reduces leakage of heat transfer fluid from below the substrate, and prevents movement or misalignment of the substrate.

Electrostatic chuck assemblies and associated sealing diaphragms of the present invention have several advantages. The sealing diaphragm 165 forms an actuable, position-adjustable seal around the chuck that enhances the erosion resistance of the chuck 30, by protecting the electrostatic member 25 of the chuck from exposure to the erosive process gases in the process chamber 65. Exposure of the electrode 25 at even a single pinhole in the insulator 40 can cause arcing between the electrode and plasma, and require replacement of the entire chuck 30. By providing a seal between the electrostatic member and the external process environment, the sealing diaphragm 165 reduces erosion and resultant catastrophic failure and rupturing of the insulator 40 covering the electrode 25. Also, the seal formed by the sealing diaphragm 165 reduces accumulation of polymeric reaction byproducts on the chuck 30, which are formed when the erosive process gas reacts with portions of the chuck. This significantly increases the useful lifetime of the chuck 30, and reduces cleaning of the chuck, particularly in the highly erosive or corrosive process environments which are often used to process the chuck.

Another significant advantage of the sealing diaphragm 165 is the ability to activate and deactivate the diaphragm from the non-sealing position 180 to the sealing position 185 during a single processing cycle of the substrate 45. Unlike prior art seals which typically remain in contact with the substrate 45 during the entire processing cycle in which the substrate is electrostatically held on the chuck 30, the present gas pressure or electromechanical actuated sealing structure 20 allows deactivation and collapsing of the sealing diaphragm 165 before the substrate is actually released from the electrostatic chuck. This reduces sticking of the diaphragm 165 to the substrate 45 and increases processing throughput. In addition, the ability to turn on and off the sealing function of the diaphragm 165 allows the diaphragm to be selectively used to form a seal at the periphery 220 of the chuck 30 during those stage of the substrate 45 processing in which erosive environments are maintained in the process chamber 65, and unseal or deseal the periphery during non-erosive process stages.

A further advantage is that the sealing diaphragm 165 can be manufactured with reduced tolerances, because the gas or electromagnetic pressure applied on the sealing diaphragm to flex and move the diaphragm into a sealing position with the substrate 45, reduces the need for a very close tolerance sealing barrier. Moreover, the sealing diaphragm 165 configurations comprising a fabricated from a resilient and compliant polymeric material provide additional fabrication tolerance because the flexible and compliant polymer can stretch under application of a gas pressure forming a seal without critical dimensioning. Yet another advantage, arises because the preferred configurations of the sealing diaphragm comprising a polymeric membrane, conformally contact only a small portion of the substrate 45 providing reducing the thermal barrier effect of the diaphragm contacting the substrate, and providing more uniform temperature control of the substrate.

While the present invention has been described in considerable detail with reference to certain preferred versions, many other versions should be apparent to those skilled in the art. For example, although illustrative sealing diaphragm structures and actuators are described herein, the sealing diaphragm 165 can comprise any resilient structure that would be apparent to one of ordinary skill in the art, such as for example, equivalent tubular, rectangular, or triangulated structures. Also, the sealing diaphragm 165 can be actuated using other energetic actuator sources, such as electrostatic, photovoltaic or radiation sources. Therefore, the spirit and scope of the appended claims should not be limited to the description of the preferred versions contained herein.

What is claimed is:

1. A sealing structure for forming a seal around a chuck, the sealing structure comprising:
    (a) a chuck for holding a substrate having a peripheral edge;
    (b) an actuated, position-adjustable, sealing diaphragm disposed along the peripheral edge of the substrate, the diaphragm having a conformal sealing surface capable of forming a seal when pressed against the peripheral edge of the substrate; and
    (c) a diaphragm actuator for actuating the sealing diaphragm from (i) a first non-sealing position in which the conformal sealing surface of the diaphragm is spaced apart from the substrate held on the chuck to form a gap therebetween, to (ii) a second sealing position in which the conformal sealing surface of the diaphragm presses against, and forms a seal with, the peripheral edge of the substrate.

2. The sealing structure of claim 1, wherein the diaphragm actuator comprises an electrical, magnetic, or electromagnetic assembly.

3. The sealing structure of claim 1, wherein the diaphragm actuator comprises (i) one or more gas apertures below the position-adjustable sealing diaphragm, and (ii) a gas controller to regulate a gas pressure in the gas apertures, after the substrate is held on the chuck, to cause the sealing diaphragm to move between the non-sealing and sealing positions.

4. The sealing structure of claim 3, wherein the diaphragm actuator comprises a mass flow controller or a gas pressure regulator.

5. The sealing structure of claim 3, wherein the position adjustable sealing diaphragm comprises a compliant membrane covering the gas apertures, and wherein the gas controller comprises a gas pressure controller for adjusting a gas pressure at the gas apertures from (i) a first pressure at which the sealing member is at the non-sealing position, to (ii) a second pressure at which the compliant membrane flexes and presses its conformal surface against the peripheral edge of the substrate to form a seal without dislodging the substrate from the chuck.

6. The sealing structure of claim 5, wherein the chuck comprises grooves for holding heat transfer fluid below the substrate, and wherein the gas pressure controller adjusts the gas pressure from a first lower pressure to a second higher pressure capable of pressing the conformal surface of the sealing diaphragm against the peripheral edge of the substrate substantially without causing heat transfer fluid to leak out from the grooves.

7. The sealing structure of claim 3, wherein the sealing diaphragm comprises a membrane fabricated from a resilient and compliant material capable of conforming to the substrate to form a seal between the substrate and the chuck.

8. The sealing structure of claim 7, wherein the membrane comprises an area covering the gas apertures that is sized sufficiently large that the force exerted by the gas pressure in the gas apertures causes the membrane to form a seal with the substrate.

9. The sealing structure of claim 8, wherein the membrane comprises an area of at least about 50 $cm^2$.

10. The sealing structure of claim 7, wherein the sealing diaphragm comprises an upstanding nipple on the membrane, the nipple having a top surface comprising the conformal sealing surface.

11. The sealing structure of claim 3, wherein the sealing diaphragm comprises a flexible member having (i) a cap portion covering the gas apertures, and (ii) a bending portion held in a point, and wherein adjustment of a gas pressure through the gas apertures causes the flexible member to bend about the point raising the cap portion to contact the substrate.

12. A gas pressure actuated sealing assembly for reducing corrosion of an electrostatic chuck in a corrosive gas environment, the chuck used to electrostatically hold a substrate having a peripheral edge, the sealing assembly comprising:

(a) a compliant flat annular membrane extending below the peripheral edge of the substrate, the membrane capping one or more gas apertures;

(b) a conformal sealing surface on the compliant membrane, the sealing surface extending continuously below the peripheral edge of the substrate; and (c) a gas pressure controller for regulating the pressure of gas maintained in the gas apertures below the membrane at (i) a first pressure at which the compliant membrane is in a non-sealing position in which the conformal sealing surface of the compliant membrane is spaced apart from the electrostatically held substrate to form a gap therebetween, and (ii) a second pressure at which the compliant membrane is in a sealing position in which the compliant membrane flexes and presses its conformal surface against the peripheral edge of the substrate to form a seal with the peripheral edge of the electrostatically held substrate without dislodging the substrate from the chuck.

13. The sealing assembly of claim 12, wherein the chuck comprises grooves for holding heat transfer fluid below the substrate, and wherein the gas pressure controller adjusts the gas pressure from a first lower pressure to a second higher pressure capable of pressing the conformal surface of the compliant membrane against the peripheral edge of the substrate substantially without causing heat transfer fluid to leak out from the grooves.

14. The sealing assembly of claim 12, wherein the compliant membrane is fabricated from a polymer that is substantially resistant to erosion by erosive process gas.

15. The sealing assembly of claim 12, wherein the compliant membrane comprises an upstanding nipple having a top surface comprising the conformal sealing surface.

16. The sealing assembly of claim 13, wherein the compliant membrane comprises (i) a cap portion covering the gas apertures, and (ii) a bending portion held in a point, and wherein adjustment of a gas pressure through the gas apertures causes the flexible member to bend about the point raising the cap portion to contact the substrate.

17. A corrosion-resistant electrostatic chuck assembly for holding a substrate in a process chamber containing corrosive process gas, the assembly comprising:

(a) an electrostatic chuck for electrostatically holding a substrate having a peripheral edge;

(b) a compliant annular diaphragm extending around the peripheral edge of the substrate, the diaphragm having a conformal sealing surface thereon; and (c) at least one gas aperture below the diaphragm, wherein application of a gas pressure through the gas aperture causes the diaphragm to flex and press the conformal sealing surface of the diaphragm against the substrate.

18. The electrostatic chuck assembly of claim 17, comprising means to flow gas through the gas aperture, after the substrate is electrostatically held on the chuck, to cause the diaphragm to flex.

19. The electrostatic chuck assembly of claim 18, wherein the means to flow gas through the gas aperture comprises a gas pressure controller for adjusting a gas pressure at the gas apertures from (i) a pressure at which the diaphragm is at the non-sealing position, to (ii) a second pressure at which the diaphragm flexes and presses its conformal surface against the peripheral edge of the substrate to form a seal, without dislodging the substrate from the chuck.

20. The electrostatic chuck assembly of claim 17, wherein the sealing diaphragm is fabricated from a polymer that is substantially resistant to erosion by erosive process gas.

21. The electrostatic chuck assembly of claim 17, wherein the sealing diaphragm comprises an upstanding nipple having a top surface comprising the conformal sealing surface.

22. The electrostatic chuck assembly of claim 17, wherein the sealing diaphragm comprises (i) a cap portion covering the gas apertures, and (ii) a bending portion held in a point, and wherein adjustment of a gas pressure through the gas apertures causes the flexible member to bend about the point raising the cap portion to contact the substrate.

23. A method of forming a seal around a chuck in a process zone, the chuck used to hold a substrate having a peripheral edge, the method comprising the steps of:

(a) positioning a gas pressure actuated sealing diaphragm along the peripheral edge of the substrate, the diaphragm capping one or more gas apertures, and the diaphragm comprising a conformal sealing surface extending continuously below the peripheral edge of the substrate; and (b) applying a gas pressure through the gas apertures below the diaphragm to cause at least a portion of the diaphragm to move and press its conformal sealing surface against the peripheral edge of the substrate to form a seal with the substrate.

24. The method of claim 23, wherein in step (a) the sealing diaphragm comprises a compliant annular membrane covering the gas apertures, the membrane being sufficiently compliant to flex under the gas pressure exerted through the gas apertures.

25. The method of claim 23, wherein in step (a) the sealing diaphragm comprises a flexible member having a cap portion covering the gas apertures, and a bending portion held between a point, and wherein in step (b), adjustment a gas pressure through the gas apertures causes the flexible member to bend about the point raising the cap portion toward the substrate to cause the conformal sealing surface to press against and form a seal with the substrate.

26. The method of claim 23, further comprising the step of adjusting the gas pressure applied through the gas apertures to lower the diaphragm upon completion of processing of the substrate.

27. A method of enhancing the erosion resistance of an electrostatic chuck in an erosive environment, the chuck comprising (i) an insulated electrode capable of electrostatically holding a substrate, and (ii) a support for supporting the insulated electrode, the support comprising gas apertures for providing a gas pressure, the method comprising the steps of:

(a) positioning an annular sealing diaphragm covering the gas aperture holes on the support so that the diaphragm is circumferentially disposed about the insulated electrode, the sealing diaphragm having a conformal sealing surface capable of forming a seal with a substrate;

(b) placing a substrate on the insulated electrode and applying a voltage to the insulated electrode to electrostatically attract the substrate onto the insulated electrode so that a peripheral edge of the substrate is positioned above the sealing diaphragm to form a gap therebetween; and (c) regulating a pressure of gas through the gas apertures below the sealing diaphragm to cause the conformal sealing surface of the diaphragm to press against the peripheral edge of the substrate forming a seal that reduces exposure of the electrostatic chuck to the erosive environment.

* * * * *